US008665029B2

(12) United States Patent
Tseng

(10) Patent No.: US 8,665,029 B2
(45) Date of Patent: Mar. 4, 2014

(54) OSCILLATOR MODULE AND REFERENCE CIRCUIT THEREOF

(75) Inventor: Wei-Kai Tseng, Tainan (TW)

(73) Assignee: Himax Technologies Limited, Tainan (TW)

( * ) Notice: Subject to any disclaimer, the term of this patent is extended or adjusted under 35 U.S.C. 154(b) by 12 days.

(21) Appl. No.: 13/445,218

(22) Filed: Apr. 12, 2012

(65) Prior Publication Data

US 2013/0271231 A1    Oct. 17, 2013

(51) Int. Cl.
*H03K 3/0231*    (2006.01)
*H03K 3/354*    (2006.01)
*H03K 3/011*    (2006.01)
*G05F 3/24*    (2006.01)
*G05F 3/26*    (2006.01)
*H03K 4/501*    (2006.01)

(52) U.S. Cl.
CPC ............... *H03K 3/354* (2013.01); *H03K 3/011* (2013.01); *H03K 3/0231* (2013.01); *G05F 3/245* (2013.01); *G05F 3/262* (2013.01); *H03K 4/501* (2013.01)
USPC ........... 331/111; 331/143; 331/176; 331/186; 323/313; 323/315; 327/538

(58) Field of Classification Search
CPC ......... G05F 3/245; G05F 3/262; H03K 3/011; H03K 3/023; H03K 3/0231; H03K 3/02315; H03K 3/353; H03K 3/354; H03K 3/3545; H03K 4/12; H03K 4/50; H03K 4/501; H03K 4/502
USPC .......... 323/313, 315; 327/198, 530, 538, 539; 331/57, 111, 143, 176, 185, 186
See application file for complete search history.

(56) References Cited

U.S. PATENT DOCUMENTS

| 5,448,158 | A  | * | 9/1995  | Ryat .............................. 323/315 |
| 5,699,024 | A  | * | 12/1997 | Manlove et al. .............. 331/111 |
| 5,912,593 | A  | * | 6/1999  | Susak et al. .................... 331/111 |
| 6,020,792 | A  | * | 2/2000  | Nolan et al. .................... 331/111 |
| 6,369,712 | B2 | * | 4/2002  | Letkomiller et al. ....... 340/572.1 |
| 6,515,551 | B1 | * | 2/2003  | Mar et al. ....................... 331/111 |
| 7,034,627 | B1 | * | 4/2006  | Kudari ........................... 331/143 |
| 7,236,061 | B2 | * | 6/2007  | Lin ................................. 331/66 |
| 7,535,309 | B2 | * | 5/2009  | Maher ........................... 331/176 |
| 7,598,822 | B2 | * | 10/2009 | Rajagopal et al. ............. 331/176 |
| 7,884,679 | B2 | * | 2/2011  | Mahooti ........................ 331/143 |
| 8,198,947 | B2 | * | 6/2012  | Schatzberger ................ 331/111 |
| 8,405,376 | B2 | * | 3/2013  | Hwang et al. ................. 323/314 |

\* cited by examiner

*Primary Examiner* — Levi Gannon
(74) *Attorney, Agent, or Firm* — J.C. Patents

(57) ABSTRACT

A reference circuit for an oscillator module is provided. The reference circuit includes a reference voltage generation unit and a reference current generation unit. The reference voltage generation unit includes an electric element having a voltage proportional to absolute temperature (PTAT voltage) and provides a reference voltage based on the PTAT voltage. The reference current generation unit is coupled to the reference voltage generation unit and provides a reference current to the oscillator circuit to serve as an input current based on the PTAT voltage. The oscillator circuit generates a clock signal based on the reference voltage and the input current. The reference voltage and the input current are proportional to absolute temperature and have the same change trend relative to absolute temperature, such that the clock signal is a temperature insensitive signal. An oscillator module including an oscillator circuit and the foregoing reference circuit is also provided.

12 Claims, 3 Drawing Sheets

OSCILLATOR MODULE AND REFERENCE CIRCUIT THEREOF

BACKGROUND OF THE INVENTION

1. Field of the Invention

The invention relates to an electronic circuit, and more particularly to an oscillator module and a reference circuit thereof.

2. Description of Related Art

FIG. 1 is a schematic diagram of a conventional oscillator circuit. FIG. 2 shows voltage waveforms of nodes A and B and a clock signal CLK of the conventional oscillator circuit. Referring to FIG. 1 and FIG. 2, the conventional oscillator circuit 110 is configured to generate a temperature insensitive clock signal CLK based on an input current IIN and a reference voltage VREF. During a period Ta, a capacitor $C_A$ is charged by the input current IIN, such that the voltage of the node A increases to the reference voltage VREF, and the clock signal CLK stays at a high level in the meanwhile. Until the voltage of the node A is substantially equal to the reference voltage VREF, an RS flip-flop 112 is triggered, and then a current path that a capacitor $C_B$ is charged is conducted. Accordingly, the voltage of the node B is charged by the input current IIN and increases to the reference voltage VREF during a period Tb. The clock signal CLK stays at a low level during this period. Until the voltage of the node B is substantially equal to the reference voltage VREF, the RS flip-flop 112 is triggered again, and then the capacitor $C_A$ is charged by the input current IIN. The foregoing operation is repeated as time goes on, and thus the oscillator circuit 110 outputs the temperature insensitive clock signal CLK with a period T.

In order to generate a temperature insensitive clock signal, a reference circuit of the oscillator circuit (not shown) must provide a temperature insensitive input current and a temperature insensitive reference voltage to the oscillator circuit. However, for providing the temperature insensitive input current, an extra circuit design for the reference circuit is necessary. As a result, extra circuit area and power are consumed in the conventional reference circuit.

SUMMARY OF THE INVENTION

The invention is directed to an oscillator module which provides a temperature insensitive clock signal based on a reference voltage and an input current proportional to absolute temperature (PTAT).

The invention is directed to a reference circuit which provides a reference voltage and an input current proportional to absolute temperature to an oscillator module.

The invention provides an oscillator module including an oscillator circuit and a reference circuit. The oscillator circuit generates a clock signal based on a reference voltage and an input current. The reference circuit is coupled to the oscillator circuit and provides the reference voltage and the input current based on a voltage proportional to absolute temperature. The reference voltage and the input current are proportional to absolute temperature, such that the clock signal is a temperature insensitive signal.

In an embodiment of the invention, the reference circuit includes a reference voltage generation unit and a reference current generation unit. The reference voltage generation unit includes an electric element having the voltage proportional to absolute temperature. The reference voltage generation unit provides the reference voltage based on the voltage proportional to absolute temperature. The reference current generation unit is coupled to the reference voltage generation unit and provides a reference current to serve as the input current based on the voltage proportional to absolute temperature.

In an embodiment of the invention, the reference voltage generation unit includes a first current generation unit and a voltage divider unit. The first current generation unit includes the electric element and provides a first current based on the voltage proportional to absolute temperature. The first current is proportional to absolute temperature. The voltage divider unit is coupled to the first current generation unit, receives the first current, and provides the reference voltage based on a divider ratio of the voltage divider unit and the first current.

In an embodiment of the invention, the first current generation unit includes a current source and a plurality of first current mirror. The current source includes the electric element and provides a current proportional to absolute temperature based on the voltage proportional to absolute temperature. The plurality of first current mirrors are coupled to the current source and mirror the current proportional to absolute temperature to the voltage divider unit to serve as the first current.

In an embodiment of the invention, the reference current generation unit circuit includes a second current generation unit. The second current generation unit provides a second current to the oscillator circuit to serve as the input current based on the voltage proportional to absolute temperature. The second current is proportional to absolute temperature.

In an embodiment of the invention, the second current generation unit includes a plurality of second current mirrors. The plurality of second current mirrors are coupled to the first current generation unit and mirror the current proportional to absolute temperature to the oscillator circuit to serve as the input current.

In an embodiment of the invention, the voltage divider unit includes a plurality of resistor units. The plurality of resistor units are coupled in series and have a first terminal, a second terminal, and a voltage providing node. The first terminal is coupled to the first current generation unit for receiving the first current, and the second terminal is grounded. The voltage providing node provides the reference voltage based on the divider ratio and the first current, and the divider ratio is determined based on resistors of the resistor units.

In an embodiment of the invention, the electric element includes a bipolar junction transistor (BJT), and the voltage proportional to absolute temperature includes a junction voltage of the BJT.

The invention provides a reference circuit for an oscillator module. The oscillator module includes an oscillator circuit. The reference circuit includes a reference voltage generation unit and a reference current generation unit. The reference voltage generation unit includes an electric element having a voltage proportional to absolute temperature and provides a reference voltage based on the voltage proportional to absolute temperature. The reference current generation unit is coupled to the reference voltage generation unit and the oscillator circuit and provides a reference current to the oscillator circuit to serve as an input current based on the voltage proportional to absolute temperature. The oscillator circuit generates a clock signal based on the reference voltage and the input current. The reference voltage and the input current are proportional to absolute temperature, such that the clock signal is a temperature insensitive signal.

In an embodiment of the invention, the reference voltage generation unit includes a first current generation unit and a voltage divider unit. The first current generation unit includes the electric element and provides a first current based on the voltage proportional to absolute temperature. The first current is proportional to absolute temperature. The voltage divider unit is coupled to the first current generation unit, receives the first current, and provides the reference voltage based on a divider ratio of the voltage divider unit and the first current.

In an embodiment of the invention, the first current generation unit includes a current source and a plurality of first current mirrors. The current source includes the electric element and provides a current proportional to absolute temperature based on the voltage proportional to absolute temperature. The plurality of first current mirrors are coupled to the current source and mirror the current proportional to absolute temperature to the voltage divider unit to serve as the first current.

In an embodiment of the invention, the reference current generation unit circuit includes a second current generation unit. The second current generation unit provides a second current to the oscillator circuit to serve as the input current based on the voltage proportional to absolute temperature. The second current is proportional to absolute temperature.

In an embodiment of the invention, the second current generation unit includes a plurality of second current mirrors. The plurality of second current mirrors are coupled to the first current generation unit and mirror the current proportional to absolute temperature to the oscillator circuit to serve as the input current.

In an embodiment of the invention, the voltage divider unit includes a plurality of resistor units. The plurality of resistor units are coupled in series and have a first terminal, a second terminal, and a voltage providing node. The first terminal is coupled to the first current generation unit for receiving the first current, and the second terminal is grounded. The voltage providing node provides the reference voltage based on the divider ratio and the first current, and the divider ratio is determined based on resistors of the resistor units.

In an embodiment of the invention, the electric element includes a bipolar junction transistor (BJT), and the voltage proportional to absolute temperature includes a junction voltage of the BJT.

According to the above descriptions, the reference circuit provides the reference voltage and the input current proportional to absolute temperature to the oscillator circuit. The provided reference voltage and input current have the same change trend relative to absolute temperature. Therefore, the oscillator module outputs a temperature insensitive clock signal based on the reference voltage and the input current.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The reference circuit of the disclosure can be widely used to provide the reference voltage and the input current to any type of an oscillator circuit. In order to fully convey the spirit of the disclosure, an exemplary embodiment of applying the reference circuit of the disclosure in an oscillator circuit is described in detail below with reference of figures.

Figure 1:
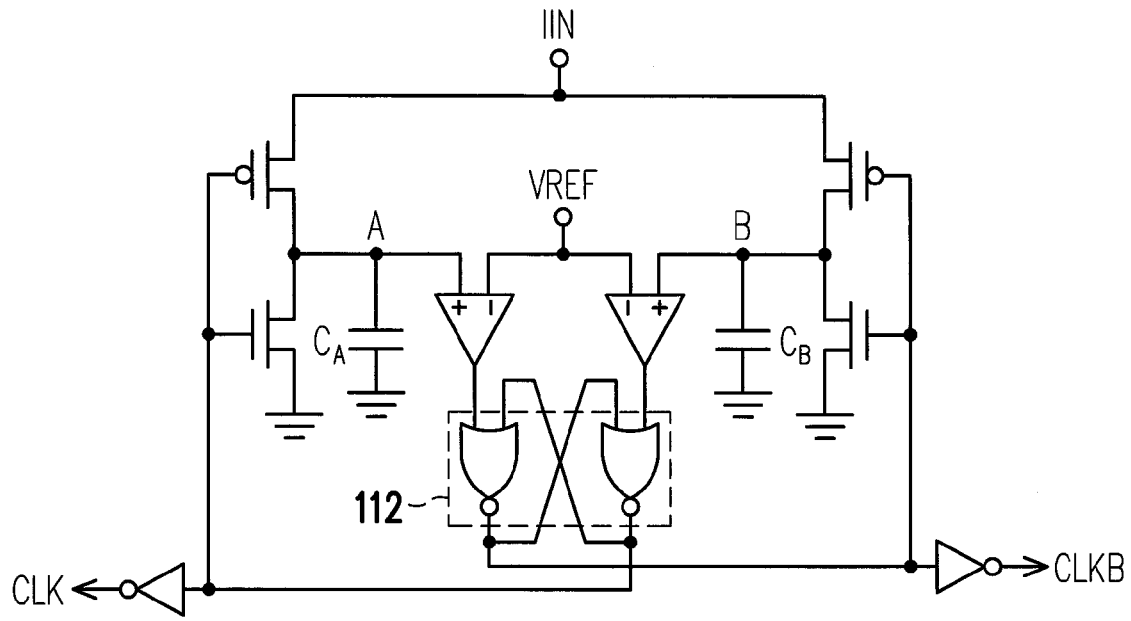
FIG. 1 is a schematic diagram of a conventional oscillator circuit.
Figure 2:
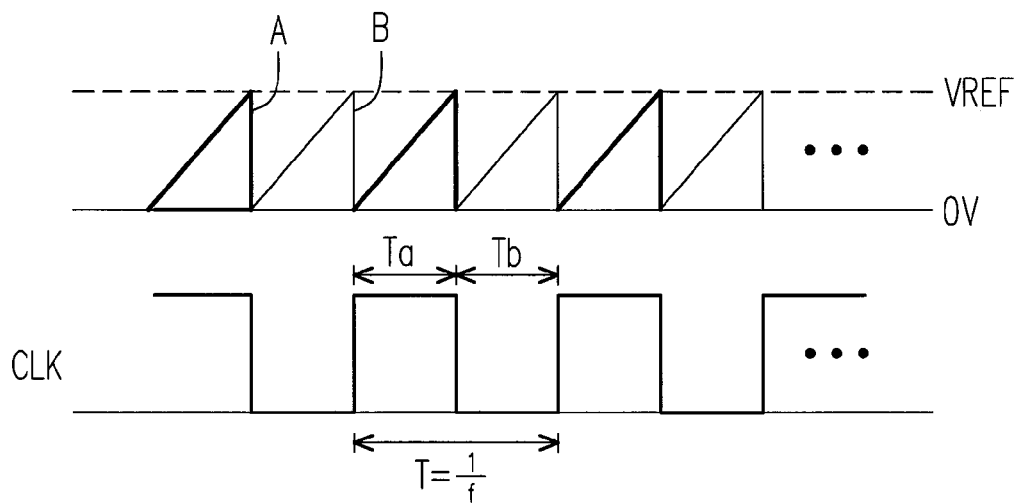
FIG. 2 shows voltage waveforms of nodes A and B and a clock signal CLK of the conventional oscillator circuit.
Figure 3:
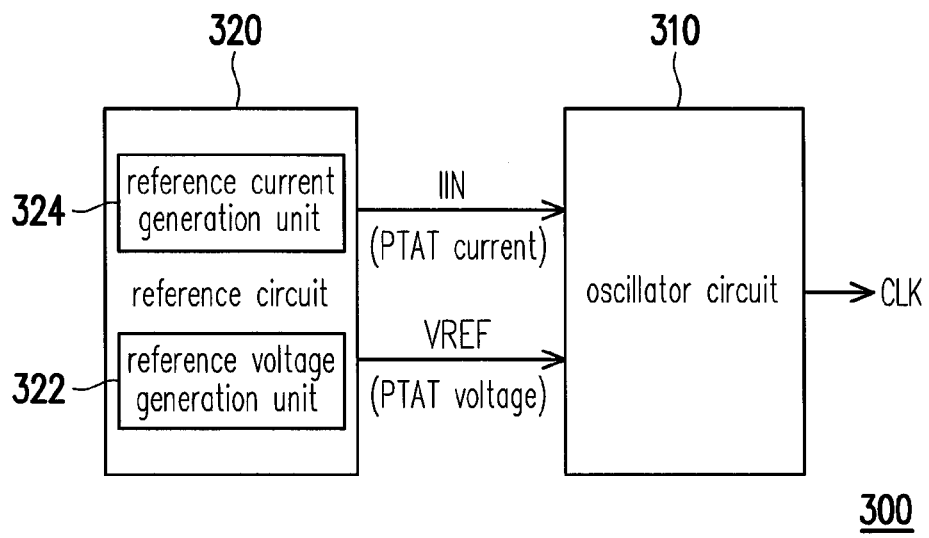
FIG. 3 illustrates a schematic diagram of an oscillator module according to an embodiment of the invention.

FIG. 3 illustrates a schematic diagram of an oscillator module according to an embodiment of the invention. Referring to FIG. 3, the oscillator module 300 of the present embodiment includes an oscillator circuit 310 and a reference circuit 320. The oscillator circuit 310 generates a clock signal CLK based on a reference voltage VREF and an input current IIN. The reference circuit 320 is coupled to the oscillator circuit 310 and provides the reference voltage VREF and the input current IIN based on a voltage proportional to absolute temperature, i.e. a PTAT voltage. Herein, the voltage proportional to absolute temperature may be a junction voltage of a bipolar junction transistor (BJT), but the invention is not limited thereto. The reference voltage VREF and the input current TIN are proportional to absolute temperature and have the same change trend relative to absolute temperature. Therefore, the generated clock signal CLK is a temperature insensitive signal.

To be specific, the reference circuit 320 of the present embodiment includes a reference voltage generation unit 322 and a reference current generation unit 324. The reference voltage generation unit 322 includes an electric element such as a BJT having a junction voltage proportional to absolute temperature. The reference voltage generation unit 322 provides the reference voltage VREF based on the junction voltage of the BJT proportional to absolute temperature. The reference current generation unit 324 is coupled to the reference voltage generation unit 322 and provides a reference current such as a PTAT current (not shown) to serve as the input current TIN based on the junction voltage of the BJT.

In the present embodiment, the reference voltage VREF and the input current TIN are proportional to absolute temperature and have the same change trend relative to absolute temperature. Therefore, the generated clock signal CLK is a temperature insensitive signal. Extra circuit design to keep the input current TIN temperature insensitive is unnecessary, and thus circuit area and power consumption are saved in the disclosure. Furthermore, the oscillator circuit 310 of the present embodiment may be implemented as the oscillator circuit 110. However, the reference circuit 320 of the disclosure can be widely used to provide the reference voltage VREF and the input current TIN to any type of an oscillator circuit, and thus the implementation of the oscillator circuit 310 is not limited to that of the oscillator circuit 110.

Figure 4:
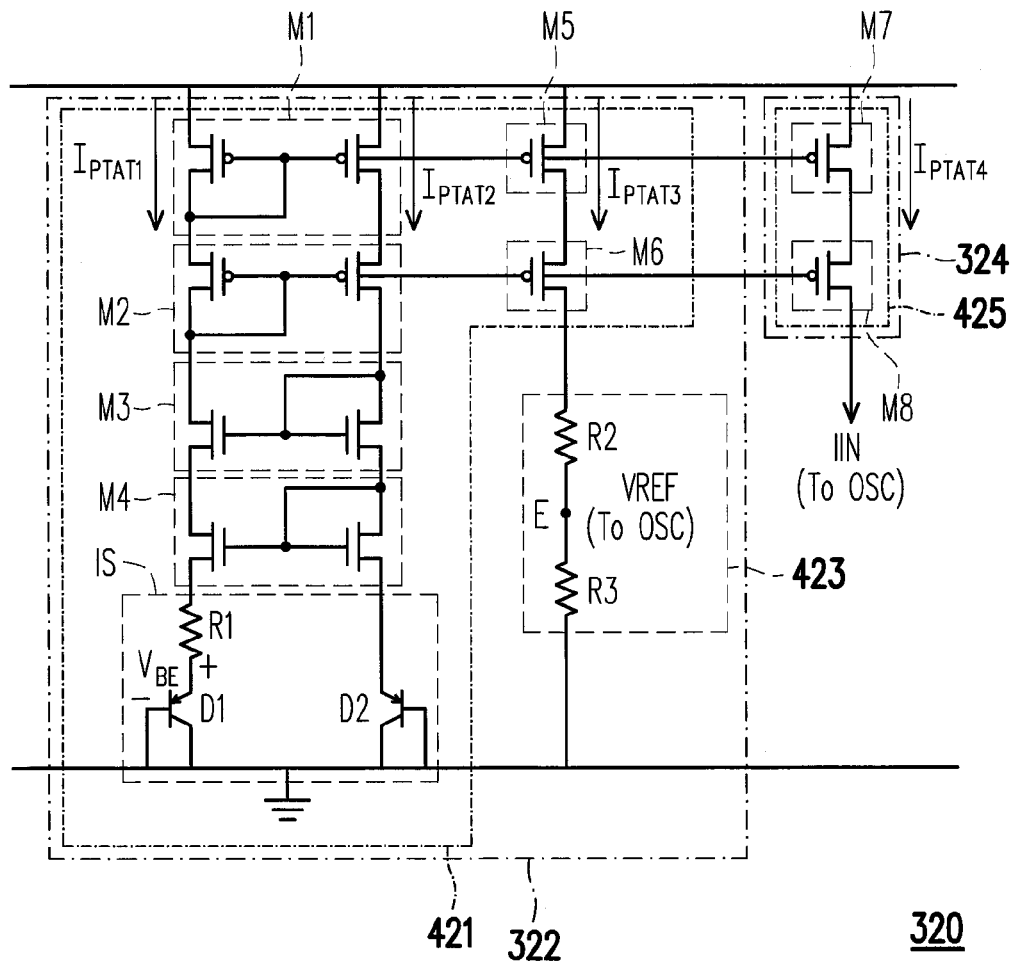
FIG. 4 illustrates a detail circuit diagram of the reference circuit 320 in FIG. 3 according to an embodiment of the invention.

FIG. 4 illustrates a detail circuit diagram of the reference circuit 320 in FIG. 3 according to an embodiment of the invention. Referring to FIG. 4, the reference voltage generation unit 322 includes a first current generation unit 421 and a voltage divider unit 423. The first current generation unit 421 provides a first current $I_{PTAT3}$ to the voltage divider unit 423 based on the junction voltage $\Delta V_{BE}$ of the bipolar junction transistor D1 which is proportional to absolute temperature. Accordingly, the first current $I_{PTAT3}$ is proportional to absolute temperature. In the present embodiment, the first current generation unit 421 includes a current source IS and a plurality of first current mirrors M1 to M6. The current source IS includes a differential pair formed by the bipolar junction transistors D1 and D2 and a resistor R1. The differential pair provides the PTAT current $I_{PTAT1}$ based on the junction voltage $\Delta V_{BE}$. Accordingly, the PTAT current $I_{PTAT1}$ is proportional to absolute temperature. To be specific, the first current mirrors M1 to M4 are connected in cascade and coupled to the current source IS. One end of the current mirror M4 is electrically connected to a ground voltage through the resistor R1 and the bipolar junction transistor D1, and another end of the current mirror M4 is electrically connected to the ground voltage through the bipolar junction transistor D2. In this way, the first current generation unit 421 can map the PTAT current $I_{PTAT1}$ through the first current mirrors M5 and M6. The first current mirrors M5 and M6 mirror the PTAT current $I_{PTAT1}$ to the voltage divider unit 423 to serve as the first current $I_{PTAT3}$. Accordingly, the first current $I_{PTAT3}$ is also proportional to absolute temperature.

The voltage divider unit 423 is coupled to the first current generation unit 421. The voltage divider unit 423 receives the first current $I_{PTAT3}$ and provides the reference voltage VREF based on a divider ratio of the voltage divider unit 423 and the first current $I_{PTAT3}$. In the present embodiment, the voltage divider unit 423 includes a plurality of resistor units. Each of the resistor units is implemented by one resistor, and resistors R2 and R3 are exemplary herein. In another embodiment, each of the resistor units may include a plurality of resistors coupled in parallel or any type of resistors. The resistors R2 and R3 are coupled in series and have a first terminal, a second terminal, and a voltage providing node. The first terminal is coupled to the first current generation unit 421 for receiving the first current $I_{PTAT3}$, and the second terminal is grounded. The voltage providing node E provides the reference voltage VREF based on the divider ratio and the first current $I_{PTAT3}$, and the divider ratio is determined based on resistances of the resistors R2 and R3. For example, the divider ratio may be defined as R2/(R2+R3), and the reference voltage VREF is equal to $I_{PTAT3} \times R2/(R2+R3)$, where R2 and R3 respectively represent the resistances of the resistors R2 and R3, and $I_{PTAT3}$ represents a current value of the first current $I_{PTAT3}$. Accordingly, the reference voltage VREF is proportional to absolute temperature.

On the other hand, the reference current generation unit circuit 324 includes a second current generation unit 425. The second current generation unit 425 provides a second current $I_{PTAT4}$ to the oscillator circuit 310 to serve as the input current TIN based on the junction voltage $\Delta V_{BE}$. Accordingly, the second current $I_{PTAT4}$ or the input current IIN is proportional to absolute temperature. To be specific, the second current generation unit 425 includes a plurality of second current mirrors M7 and M8. The second current mirrors M7 and M8 are connected in cascade and coupled to the first current generation unit 421. The second current mirrors M7 and M8 mirror the PTAT current $I_{PTAT1}$ to the oscillator circuit 310 to serve as the input current IIN. Similar to the first current generation unit 421, the second current generation unit 425 can map the PTAT current $I_{PTAT1}$ through the second current mirrors M7 and M8. The second current mirrors M7 and M8 mirror the PTAT current $T_{PTAT1}$ to the oscillator circuit 310 to serve as the input current IIN. Accordingly, the second current $I_{PTAT4}$ or the input current IIN is also proportional to absolute temperature.

Figure 5:
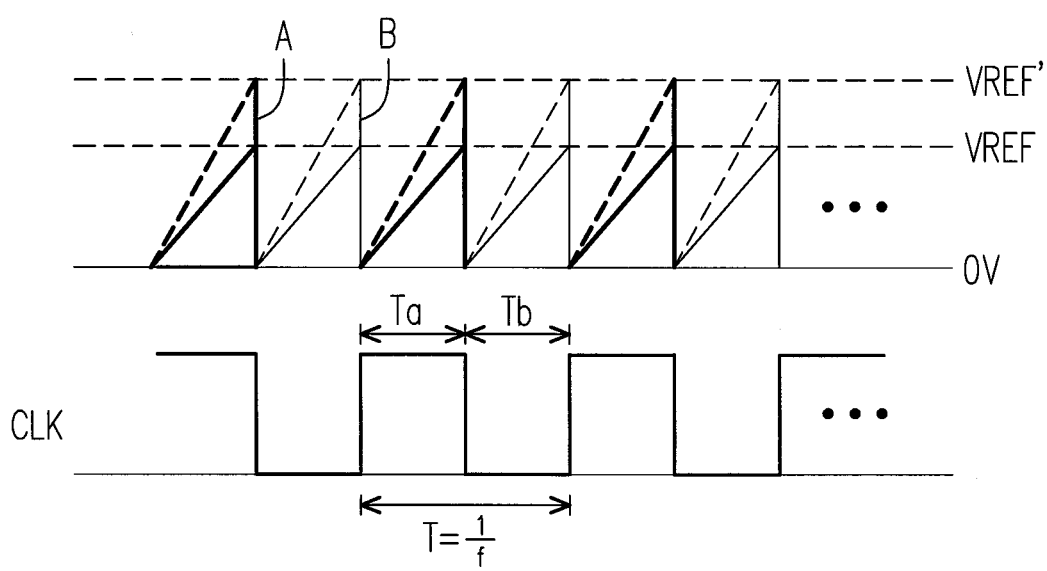
FIG. 5 shows voltage waveforms of nodes A and B and the clock signal CLK of the oscillator circuit 310 according to an embodiment of the invention.

FIG. 5 shows voltage waveforms of nodes A and B and the clock signal CLK of the oscillator circuit 310 according to an embodiment of the invention. Referring to FIG. 5, the oscillator circuit 310 of the present embodiment may be implemented as the oscillator circuit 110. In the present embodiment, the period T of the clock signal CLK satisfies a formula:

$$T = \frac{2 \times VREF \times C}{IIN};$$

where VREF is a voltage value of the reference voltage VREF, IIN is a current value of the input current IIN, and C is a capacitance of the capacitor $C_A$ or $C_B$.

The reference voltage VREF and the input current TIN are proportional to absolute temperature. Once the temperature increases, the reference voltage VREF and the input current IIN will increase along with the temperature. For example, the reference voltage VREF may increase to the reference voltage VREF'. Since the reference voltage VREF and the input current IIN have the same change trend relative to absolute temperature, the oscillator module can keep the clock signal CLK temperature insensitive. Accordingly, the clock signal CLK have the identical period T whether the temperature changes.

In summary, in the exemplary embodiments of the invention, the reference circuit for the oscillator circuit provides the reference voltage and the input current proportional to absolute temperature. The reference voltage and the input current proportional to absolute temperature have the same change trend relative to absolute temperature. Therefore, the clock signal generated by the oscillator circuit is a temperature insensitive signal. Extra circuit design for the reference circuit to keep the input current temperature insensitive is unnecessary, and thus circuit area and power consumption are saved in the disclosure.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An oscillator module, comprising:
   an oscillator circuit generating a clock signal based on a reference voltage and an input current; and
   a reference circuit coupled to the oscillator circuit and providing the reference voltage and the input current based on a voltage proportional to absolute temperature,
   wherein the reference voltage and the input current are proportional to absolute temperature, such that the clock signal is a temperature insensitive signal,
   wherein the reference circuit comprises:
   a reference voltage generation unit comprising an electric element having the voltage proportional to absolute temperature, and the reference voltage generation unit providing the reference voltage based on the voltage proportional to absolute temperature; and
   a reference current generation unit coupled to the reference voltage generation unit and providing a reference current to serve as the input current based on the voltage proportional to absolute temperature,
   wherein the reference voltage generation unit comprises:
   a first current generation unit comprising the electric element and providing a first current based on the voltage proportional to absolute temperature, wherein the first current is proportional to absolute temperature; and
   a voltage divider unit coupled to the first current generation unit, receiving the first current, and providing the reference voltage based on a divider ratio of the voltage divider unit and the first current.

2. The oscillator module as claimed in claim 1, wherein the first current generation unit comprises:
- a current source comprising the electric element and providing a current proportional to absolute temperature based on the voltage proportional to absolute temperature; and
- a plurality of first current mirrors coupled to the current source and minoring the current proportional to absolute temperature to the voltage divider unit to serve as the first current.

3. The oscillator module as claimed in claim 2, wherein the reference current generation unit circuit comprises:
- a second current generation unit providing a second current to the oscillator circuit to serve as the input current based on the voltage proportional to absolute temperature, wherein the second current is proportional to absolute temperature.

4. The oscillator module as claimed in claim 3, wherein the second current generation unit comprises:
- a plurality of second current mirrors coupled to the first current generation unit and minoring the current proportional to absolute temperature to the oscillator circuit to serve as the input current.

5. The oscillator module as claimed in claim 1, wherein the voltage divider unit comprises:
- a plurality of resistor units coupled in series and having a first terminal, a second terminal, and a voltage providing node, wherein the first terminal is coupled to the first current generation unit for receiving the first current, the second terminal is grounded, the voltage providing node provides the reference voltage based on the divider ratio and the first current, and the divider ratio is determined based on resistors of the resistor units.

6. The oscillator module as claimed in claim 1, wherein the electric element comprises a bipolar junction transistor (BJT), and the voltage proportional to absolute temperature comprises a junction voltage of the BJT.

7. A reference circuit for an oscillator module, wherein the oscillator module comprises an oscillator circuit, the reference circuit comprising:
- a reference voltage generation unit comprising an electric element having a voltage proportional to absolute temperature, and the reference voltage generation unit providing a reference voltage based on the voltage proportional to absolute temperature; and
- a reference current generation unit coupled to the reference voltage generation unit and the oscillator circuit and providing a reference current to the oscillator circuit to serve as an input current based on the voltage proportional to absolute temperature,
- wherein the oscillator circuit generates a clock signal based on the reference voltage and the input current, and the reference voltage and the input current are proportional to absolute temperature, such that the clock signal is a temperature insensitive signal,
- wherein the reference voltage generation unit comprises:
  - a first current generation unit comprising the electric element and providing a first current based on the voltage proportional to absolute temperature, wherein the first current is proportional to absolute temperature; and
  - a voltage divider unit coupled to the first current generation unit, receiving the first current, and providing the reference voltage based on a divider ratio of the voltage divider unit and the first current.

8. The reference circuit as claimed in claim 7, wherein the first current generation unit comprises:
- a current source comprising the electric element and providing a current proportional to absolute temperature based on the voltage proportional to absolute temperature; and
- a plurality of first current minors coupled to the current source and mirroring the current proportional to absolute temperature to the voltage divider unit to serve as the first current.

9. The reference circuit as claimed in claim 8, wherein the reference current generation unit circuit comprises:
- a second current generation unit providing a second current to the oscillator circuit to serve as the input current based on the voltage proportional to absolute temperature, wherein the second current is proportional to absolute temperature.

10. The reference circuit as claimed in claim 9, wherein the second current generation unit comprises:
- a plurality of second current minors coupled to the first current generation unit and mirroring the current proportional to absolute temperature to the oscillator circuit to serve as the input current.

11. The reference circuit as claimed in claim 7, wherein the voltage divider unit comprises:
- a plurality of resistor units coupled in series and having a first terminal, a second terminal, and a voltage providing node, wherein the first terminal is coupled to the first current generation unit for receiving the first current, the second terminal is grounded, the voltage providing node provides the reference voltage based on the divider ratio and the first current, and the divider ratio is determined based on resistors of the resistor units.

12. The reference circuit as claimed in claim 7, wherein the electric element comprises a bipolar junction transistor (BJT), and the voltage proportional to absolute temperature comprises a junction voltage of the BJT.

* * * * *